United States Patent
Sung et al.

(10) Patent No.: US 7,825,014 B2
(45) Date of Patent: Nov. 2, 2010

(54) METHOD FOR FABRICATING SEMICONDUCTOR DEVICE

(75) Inventors: Min-Gyu Sung, Ichon-shi (KR); Hong-Seon Yang, Ichon-shi (KR); Tae-Kwon Lee, Ichon-shi (KR); Won Kim, Ichon-shi (KR); Kwan-Yong Lim, Ichon-shi (KR); Seung-Ryong Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 188 days.

(21) Appl. No.: 12/165,339

(22) Filed: Jun. 30, 2008

(65) Prior Publication Data

US 2009/0111256 A1    Apr. 30, 2009

(30) Foreign Application Priority Data

Oct. 31, 2007    (KR) ............... 10-2007-0110347

(51) Int. Cl.
*H01L 21/26* (2006.01)
*H01L 21/42* (2006.01)

(52) U.S. Cl. ............... 438/513; 438/752; 438/775; 257/E21.006; 257/E21.17; 257/E21.021; 257/E21.267; 257/E21.269; 257/E21.293; 257/E21.311; 257/E21.319; 257/E21.645; 257/E21.646

(58) Field of Classification Search ............ 438/513, 438/509, 238, 381, 679, 680, 684, 475, 672, 438/769, 752, 775; 257/E21.006, 17, 21, 257/267, 269, 292, 311, 319, 645, 646
See application file for complete search history.

(56) References Cited

U.S. PATENT DOCUMENTS

| | | | |
|---|---|---|---|
| 6,319,769 B1 * | 11/2001 | Cho ............... | 438/255 |
| 6,335,240 B1 * | 1/2002 | Kim et al. ........ | 438/253 |
| 6,780,704 B1 * | 8/2004 | Raaijmakers et al. ...... | 438/239 |
| 6,831,315 B2 * | 12/2004 | Raaijmakers et al. ...... | 257/296 |

FOREIGN PATENT DOCUMENTS

| | | |
|---|---|---|
| KR | 1020000056496 A | 9/2000 |
| KR | 1020060010927 A | 2/2006 |
| KR | 1020060073048 A | 6/2006 |
| KR | 1020070002993 A | 1/2007 |
| KR | 1020070014555 A | 2/2007 |

OTHER PUBLICATIONS

Lahav and Grim, "Measurement of thermal expansion coefficients of W, WSi, WN, and WSiN thin film metallizations," *J. Appl. Phys.* 67:734-738 (1990).

Lim et al., "The sheet resistance instability in the sub-100 nm tungsten poly-metal wordline due to an in-situ $NH_3$ pre-annealing during the sealing nitride deposition," *Extended Abstracts of the 2003 International Conference on Solid State Devices and Materials*, pp. 482-483, Tokyo (2003).

* cited by examiner

*Primary Examiner*—David Nhu
(74) *Attorney, Agent, or Firm*—Townsend and Townsend and Crew LLP

(57) ABSTRACT

A method for fabricating a semiconductor device includes forming a pattern including a first layer including tungsten, performing a gas flowing process on the pattern in a gas ambience including nitrogen, and forming a second layer over the pattern using a source gas including nitrogen, wherein the purge is performed at a given temperature for a given period of time in a manner that a reaction between the first layer and the nitrogen used when forming the second layer is controlled.

20 Claims, 13 Drawing Sheets

(PRIOR ART)

(A)  (B)

(A)        (B)

(A)        (B)

METHOD FOR FABRICATING SEMICONDUCTOR DEVICE

CROSS-REFERENCE TO RELATED APPLICATIONS

The present invention claims priority of Korean patent application number 10-2007-0110347, filed on Oct. 31, 2007, which is incorporated by reference in its entirety.

BACKGROUND OF THE INVENTION

The present invention relates to a method for fabricating a semiconductor device, and more particularly, to a method for fabricating a semiconductor device which can reduce leaning (or tilting) of a patterned structure.

When performing a gate stack process using a tungsten (W) layer as an electrode including a barrier metal, a re-oxidation process is generally required to repair etch damage resulting from etching a polysilicon layer. Also, a method for capping the gate stack using substantially the same material as a nitride-based layer before performing a re-oxidation process has been widely used to prevent oxidation of a barrier metal and a tungsten layer during the re-oxidation process. Stress is generated in the gate stack when $W_2N$ or WN is formed by a reaction between the tungsten-based layer and a nitrogen (N) containing material.

For a dynamic random access memory (DRAM) device having a line width of 0.1 µm or less, an aspect ratio of a gate rapidly increases as a gate pitch decreases during a gate stack process. At this time, if bilateral symmetry of thermal stress values given to a gate stack is broken during a subsequent thermal process like a capping nitride layer formation, torque is generated in one direction, causing the gate stack structure to lean or tilt in that direction. This tilt becomes even greater as the gate pitch decreases. This is because an increased aspect ratio causes increased torque. The tilt of the gate structure may result in improperly formed self-aligned contacts, causing decreased yields.

FIG. 1 is a micrograph view of an undesirable formation generated by a short circuit between a gate and a landing plug contact due to a tilt of the gate structure. A gate tilting (see 'L') is generated when forming a capping nitride layer C. The tilt may cause a short circuit between the gate and the landing plug contact.

A tilting of this type may also occur during processes for forming bit lines and metal lines including a tungsten-based layer, e.g., a tungsten layer and a tungsten nitride layer.

SUMMARY OF THE INVENTION

Embodiments of the present invention relate to a method for fabricating a gate in a semiconductor device, which can reduce leaning (or tilting) when forming a subsequent capping nitride layer on a gate including a tungsten layer.

Other embodiments of the present invention relate to a method for fabricating a semiconductor device, which can decrease a $W_2N$ reaction caused by a subsequent process using nitrogen during a process for fabricating a pattern including a tungsten-based layer.

In accordance with an aspect of the present invention, there is provided a method for fabricating a semiconductor device. The method includes forming a pattern including a first layer including tungsten, performing a gas flowing process on the pattern in a gas ambience including nitrogen, and forming a second layer over the pattern using a source gas including nitrogen, wherein the gas flowing process is performed at a given temperature for a given period of time in a manner that a reaction between the first layer and the nitrogen used when forming the second layer is controlled.

In accordance with another aspect of the present invention, there is provided a method for fabricating a method for fabricating a gate in a semiconductor device. The method includes forming a gate stack structure including a silicon layer and a tungsten-based layer over a substrate, etching the gate stack structure until a portion of the silicon layer is etched to form a first pattern, forming capping layers over sidewalls of the first pattern using a source gas including nitrogen, and etching the remaining silicon layer to form a second pattern, wherein, before forming the capping layers, a gas flowing process is performed at a given temperature for a given period of time in a gas ambience including nitrogen in a manner that a reaction between the tungsten-based layer and the nitrogen included in the source gas used when forming the capping layers is controlled.

DESCRIPTION OF SPECIFIC EMBODIMENTS

Embodiments of the present invention relate to a method for fabricating a semiconductor device.

In accordance with embodiments of the present invention, a gas flowing process is performed for a short period of time at a low temperature on a tungsten-based layer before the capping nitride layer is formed on the tungsten-based layer in order to control the formation of $W_2N$. The $W_2N$ layer is formed as a result of a reaction between the tungsten-based layer and a nitrogen source gas that is used to form a capping nitride layer. The present inventor has discovered that unless the formation of $W_2N$ layer is controlled, a patterned structure such as a gate stack may tilt from a torque exerted on the gate stack by the $W_2N$ layer.

The embodiments of the present invention relate to a method for reducing leaning of a patterned structure by controlling stress generated in the structure including a tungsten-based layer [e.g., a tungsten (W) layer or a tungsten nitride ($WN_X$) layer] during a subsequent thermal process which uses nitrogen. Such a structure is referred to as a tungsten line hereinafter. The stress is generated when $W_2N$ or WN is formed by a reaction between the tungsten-based layer and a nitrogen (N) containing material.

Figure 1:
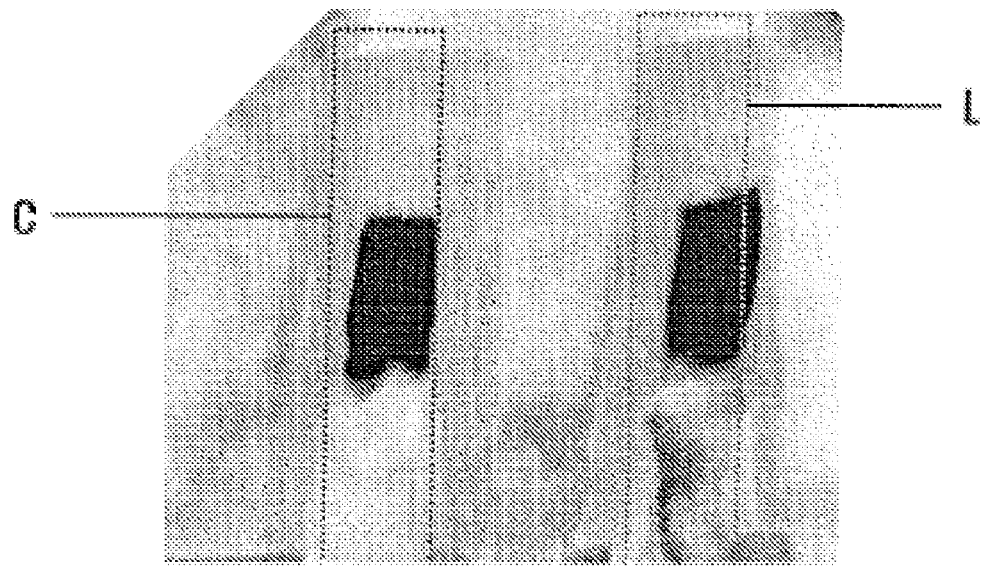
FIG. 1 is a micrograph view of an undesirable formation generated by a short circuit between a gate and a landing plug contact due to the tilting of a gate.
Figure 2A:
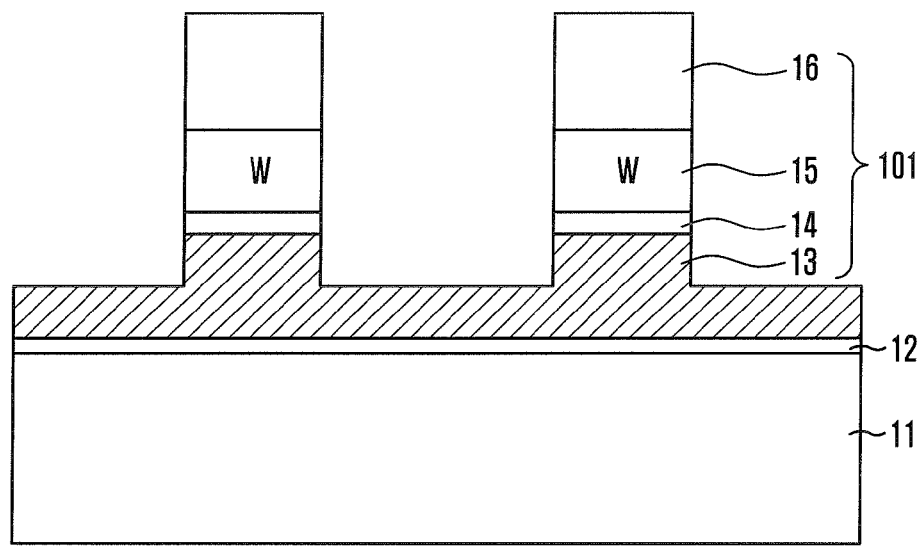
FIGS. 2A to 2C illustrate cross-sectional views of a method for fabricating gate stacks in a semiconductor device in accordance with an embodiment of the present invention.
Figure 2B:
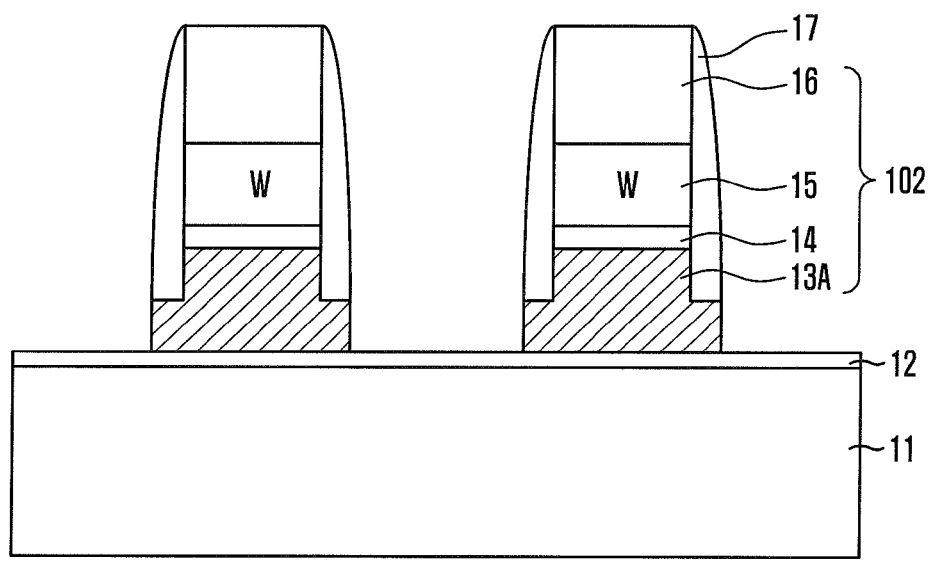
Figure 2C:
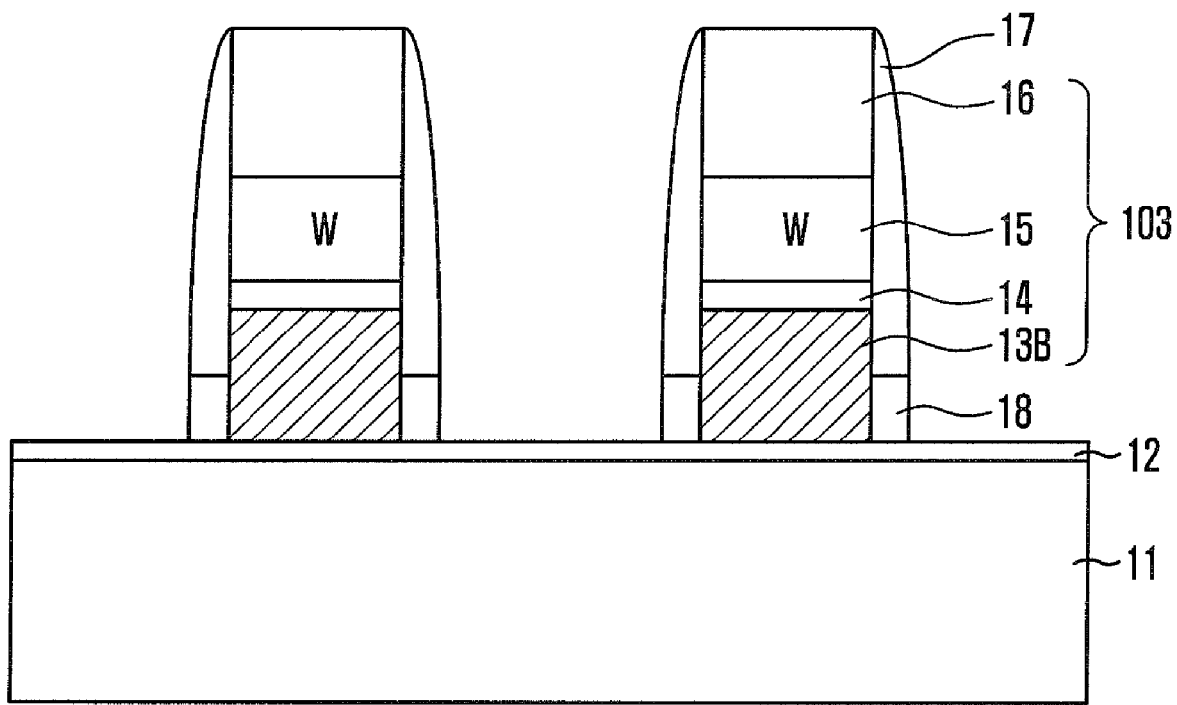

FIGS. 2A to 2C illustrate cross-sectional views of a method for fabricating gates in a semiconductor device in accordance with an embodiment of the present invention. Although there are two gates shown in the drawings, only one gate is described for convenience of description.

Referring to FIG. 2A, a gate insulation layer 12 is formed over a substrate 11. A patterned polysilicon layer 13, a barrier metal 14, a patterned tungsten layer 15, and a hard mask 16 are formed over the gate insulation layer 12.

In more detail, a polysilicon layer, a barrier metal layer, and a tungsten layer are formed over the gate insulation layer 12. A hard mask layer is formed over the tungsten layer. The hard mask layer includes a nitride-based layer.

The barrier metal layer may include a tungsten nitride ($WN_X$) layer. The barrier metal layer and the tungsten layer may be formed using a physical vapor deposition (PVD) method. Also, the tungsten layer may be formed using a chemical vapor deposition (CVD) method or an atomic layer deposition (ALD) method.

A stack structure including the polysilicon layer, the barrier metal layer, the tungsten layer, and the hard mask layer is referred to as a gate stack structure. A first gate etch process is performed. The first gate etch process includes etching the hard mask layer, the tungsten layer, the barrier metal layer, and a portion of the polysilicon layer. Thus, a first structure 101 including the patterned polysilicon layer 13, the barrier metal 14, the patterned tungsten layer 15, and the hard mask 16 is formed.

Referring to FIG. 2B, a capping layer (not shown) is formed over the first structure 101. A second gate etch process is performed. The second gate etch process includes performing an etch-back process on the capping layer and etching a portion of the patterned polysilicon layer 13. Reference numeral 13A refers to an etched polysilicon layer 13A.

Thus, a second structure 102 including the etched polysilicon layer 13A, the barrier metal 14, the patterned tungsten layer 15, and the hard mask 16 is formed. Patterned capping layers 17 are formed on portions of the sidewalls of the second structure 102.

The patterned capping layers 17 are formed to prevent the patterned tungsten layer 15 and the barrier metal 14 from being oxidized during a subsequent process, as explained below. The patterned capping layers 17 may include a nitrogen-containing layer. For instance, the patterned capping layers 17 include a silicon nitride ($Si_3N_4$) layer.

Referring to FIG. 2C, a re-oxidation process is performed to repair the etch damage on sidewalls of the etched polysilicon layer 13A. The re-oxidation process is performed in a hydrogen ambience to selectively oxidize and repair the etched polysilicon layer 13A. The patterned capping layers 17 serves to protect the patterned tungsten layer 15 and the barrier metal 14 from being oxidized during the re-oxidation process, i.e., oxidation of these layers is minimized or controlled.

The re-oxidation process converts the sidewalls of the etched polysilicon layer 13A into silicon oxide layers 18. A polysilicon layer 13B remains after the re-oxidation process. A third structure 103 including the remaining polysilicon layer 13B, the barrier metal 14, the patterned tungsten layer 15, and the hard mask 16 is defined after the re-oxidation process.

In this embodiment of the present invention, the patterned capping layer 17 includes a silicon nitride layer and may be referred to as a capping nitride layer. The capping nitride layer is formed at a high temperature ranging from approximately 600° C. to approximately 700° C. using a reaction between a nitrogen source gas and a silicon source gas, i.e., a gas including silicon. This process is referred to as a furnace process.

The capping nitride layer may be formed by using various methods. For instance, the capping nitride layer may be formed by using a low pressure chemical vapor deposition (LPCVD) method or a plasma enhanced chemical vapor deposition (PECVD) method. The nitrogen source gas includes ammonia ($NH_3$) gas. The silicon source gas includes dichlorosilane ($SiH_2Cl_2$) gas. Consequently, the capping nitride layer includes a silicon nitride ($Si_3N_4$) layer. Although the present embodiment is described using $NH_3$ and $SiH_2Cl_2$, other types of the nitrogen source gas and the silicon source gas may be used according to application.

Also in this embodiment of the present invention, a gas flowing process is performed in-situ in a gas ambience including nitrogen at substantially the same temperature range as that used in forming the capping nitride layer. This gas flowing process is performed before forming the capping nitride layer. Thus, a direct reaction between the dichlorosilane gas and the patterned structure prior to forming the capping nitride layer may be controlled during the step for forming the patterned capping layers 17. The method for forming the capping nitride layer is described in FIG. 3.

Figure 3:
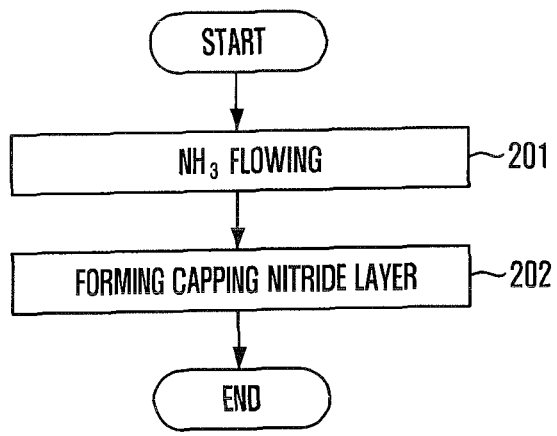
FIG. 3 illustrates a flow chart of a method for forming a capping nitride layer in accordance with an embodiment of the present invention.

FIG. 3 illustrates a flow chart of a method for forming a capping nitride layer in accordance with an embodiment of the present invention. The method for forming a capping nitride layer includes flowing $NH_3$ gas (step 201) and forming a capping nitride layer (step 202). The terms '$NH_3$ flowing step' or '$NH_3$ flowing process' is a process flowing $NH_3$ gas for a given time prior to forming the capping nitride layer.

The $NH_3$ flowing step 201 is performed at a temperature ranging from approximately 600° C. to approximately 700° C. for no more than approximately 5 minutes. When the $NH_3$ gas contacts a tungsten-based layer such as a tungsten (W) layer or a tungsten nitride ($WN_X$) layer at a sufficiently high temperature, a nitrification reaction occurs and properties of the tungsten-based layer is changed. That is, the tungsten layer is converted to 'tungsten nitride (WN)' since the tungsten layer reacted to the $NH_3$ gas, the tungsten nitride layer ($WN_X$) is converted to '$W_2N$' since the tungsten nitride layer reacted to the $NH_3$ gas. The compressive stress is relieved because of the tensile stress applied to the tungsten layer.

Forming the capping nitride layer of step 202 is performed at a temperature ranging from approximately 600° C. to approximately 700° C. using $NH_3$ gas and dichlorosilane gas as a source gas to form the capping nitride layer. The "changed" tungsten-based layer controls the production of $W_2N$ from the tungsten-based layer during step 202, thereby controlling the tilting or leaning of the gate structure.

In the present embodiment, these two steps are performed in-situ. The same nitrogen source, e.g., NH$_3$ gas, is used for these two steps. During step 201, NH$_3$ gas is flowed into a chamber for a certain period of time. Thereafter, dichlorosilane gas is flowed into the chamber during step 202, so that the chamber is provided with both NH$_3$ gas (nitrogen source) and dichlorosilane gas (silicon source), to form silicon nitride as the capping nitride layer. In the present embodiment, both of these gases are flowed into the chamber during step 202. In other embodiments, different gases may be used for the nitrogen source and/or the silicon source.

Referring to FIGS. 4 to 11, an NH$_3$ flowing process performed for a short period of time represents performing the process for approximately 5 minutes or less. For instance, the short period of time ranges from approximately 1 second to approximately 5 minutes. Also, an NH$_3$ flowing process performed for a long period of time represents performing the process for a time period greater than approximately 5 minutes. Furthermore, an NH$_3$ flowing process performed at a high temperature represents performing the process at a temperature greater than approximately 700° C. Also, an NH$_3$ flowing process performed at a low temperature represents performing the process at a temperature of approximately 700° C. or less. For instance, the low temperature ranges from approximately 600° C. to approximately 700° C.

Figure 4:
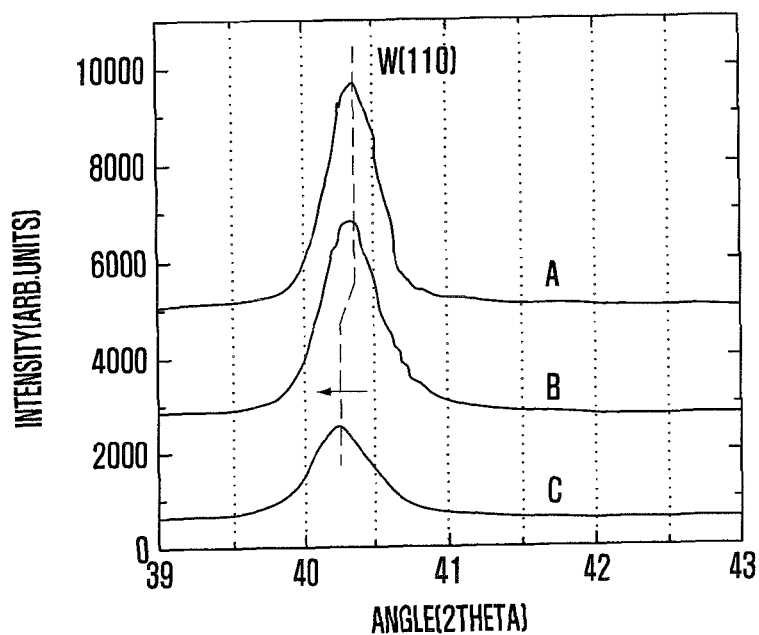
FIG. 4 illustrates a graph comparing X-ray diffraction spectrums according to different ammonia ($NH_3$) flowing times.

FIG. 4 illustrates a graph comparing X-ray diffraction (XRD) spectrums according to different ammonia (NH$_3$) flowing process times. This NH$_3$ flowing shown in the graph is performed before forming a capping nitride (Si$_3$N$_4$) layer.

Reference denotation 'A' represents an XRD spectrum when formation of the Si$_3$N$_4$ layer and the NH$_3$ flowing are not performed. Reference denotation 'B' represents a spectrum when the NH$_3$ flowing is performed for a short period of time and the Si$_3$N$_4$ layer is then formed. Reference denotation 'C' represents a spectrum when the NH$_3$ flowing is performed for a long period of time and the Si$_3$N$_4$ layer is then formed.

When the NH$_3$ flowing process is performed for a long period of time (refer to 'C'), a tungsten layer according to the XRD analysis has a lattice orientation (W 110) as a main peak which is shifting into a low angle comparing to not performing the NH$_3$ flowing process (refer to 'A') and a peak performing the NH$_3$ flowing process in a short period of time (refer to 'B'). The shift into a low angle occurs because tensile stress is generated in a direction parallel to the layer.

Generally, a tungsten layer formed using a physical vapor deposition (PVD) method obtains high compressive stress. When a capping nitride layer is formed after the tungsten layer is formed, tensile stress is generated in the tungsten layer, relieving the compressive stress in the tungsten layer.

Thus, forming the capping nitride layer relieves the stress in the tungsten layer. Particularly, levels of stress relief differ by the NH$_3$ flowing process.

Figure 5:
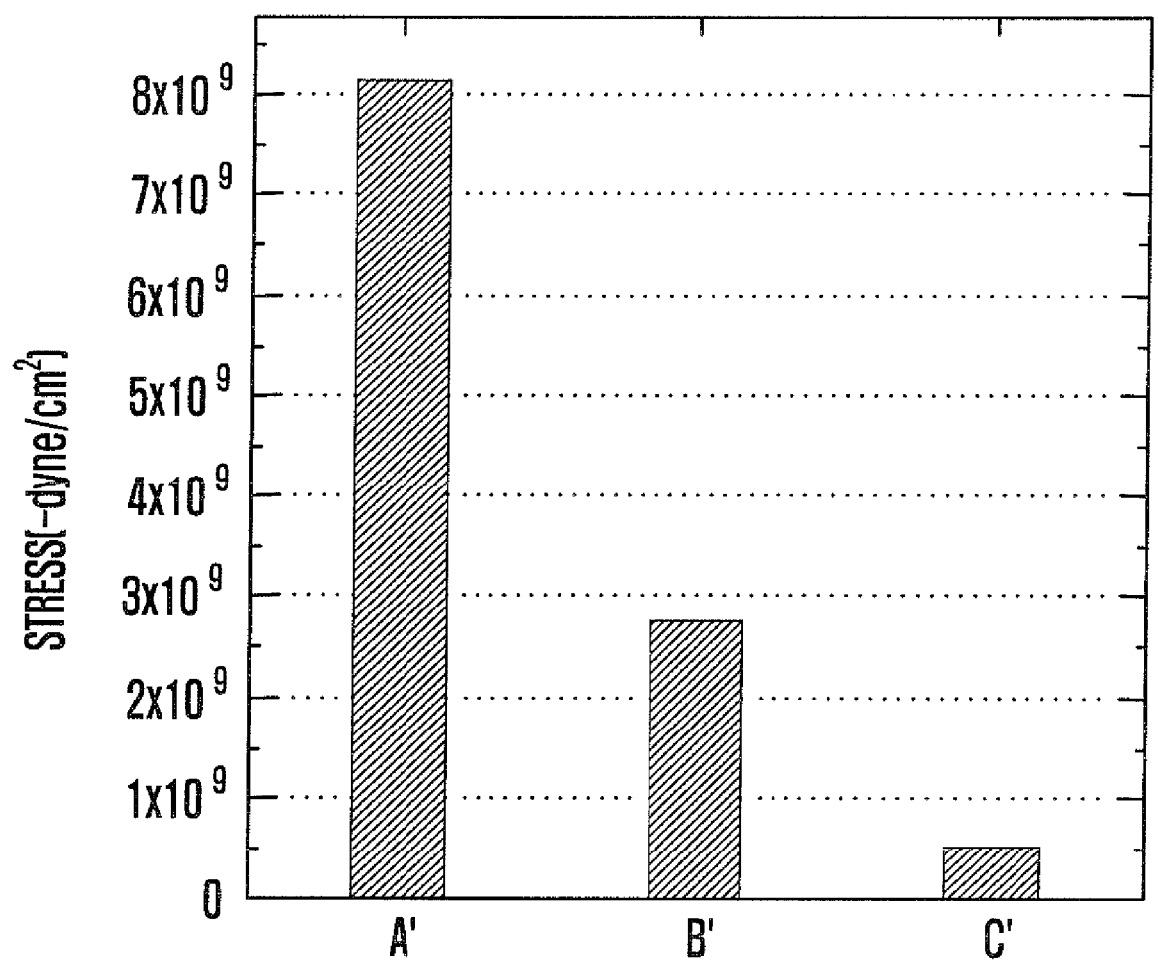
FIG. 5 illustrates a graph comparing stress changes in a tungsten layer according to different $NH_3$ flowing times.

FIG. 5 illustrates a graph comparing stress changes in a tungsten layer according to different NH$_3$ flowing process time periods. Reference denotation 'A'' represents the tungsten layer annealed in a vacuum state. Reference denotation 'B'' represents the tungsten layer on which an NH$_3$ flowing process is performed for a short period of time at a low temperature. Reference denotation 'C'' represents the tungsten layer on which an NH$_3$ flowing process is performed for a long period of time at a high temperature. The graph shows that performing the NH$_3$ flowing process at a high temperature for a long period of time results in a significant stress relief in the tungsten layer.

According to FIGS. 4 and 5, performing the NH$_3$ flowing process at a high temperature for a long period of time before forming the capping nitride layer relieves the most compressive stress in the tungsten layer. The compressive stress is relieved because of the tensile stress supplied to the tungsten layer.

However, performing the NH$_3$ flowing process for a long period of time at a high temperature may cause excessive tensile stress, and may generate volume expansion at the sidewalls of the tungsten layer.

Figure 6A:
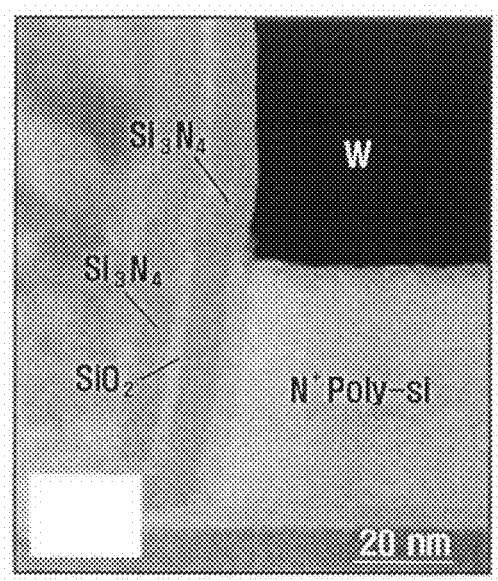
FIGS. 6A and 6B are micrograph views showing intensity of expansion of a tungsten layer according to different $NH_3$ flowing times.
Figure 6B:
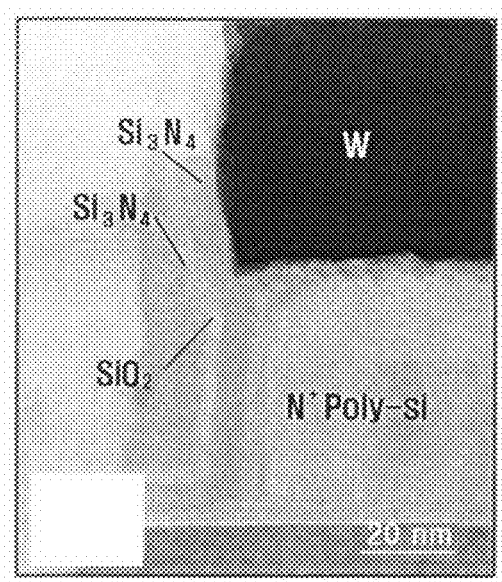

FIGS. 6A and 6B are micrograph views showing intensity of expansion of a tungsten layer according to different NH$_3$ flowing process times. Referring to FIG. 6A, an NH$_3$ flowing process is performed for a short period of time. Referring to FIG. 6B, an NH$_3$ flowing process is performed for a long period of time.

As shown in the micrograph views, volume expansion is excessively generated at the sidewalls of the tungsten layer as the NH$_3$ flowing process time period increases. Also, as the NH$_3$ flowing process time period increases, a W$_2$N peak is inordinately generated than the lattice orientation (110) in the properties of the tungsten layer. Such volume expansion is generated due to the tensile stress caused by a W$_2$N reaction.

Figure 7:
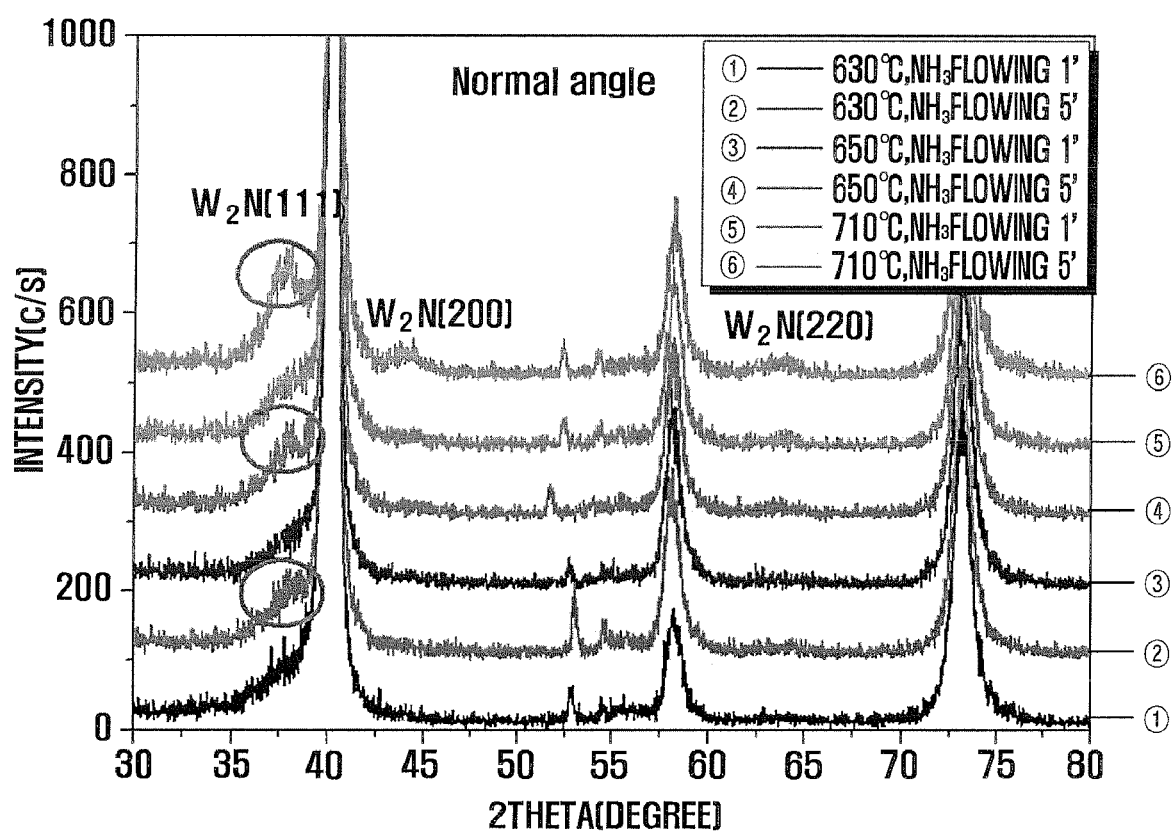
FIG. 7 illustrates a graph comparing properties of a tungsten layer when a capping nitride layer is formed after an $NH_3$ flowing is performed for a long period of time at a high temperature.

FIG. 7 illustrates a graph comparing properties of a tungsten layer when a capping nitride layer is formed after an NH$_3$ flowing process is performed for a long period of time at a high temperature. The NH$_3$ flowing process temperature increases upward in the graph. Circles in the graph each shows longer NH$_3$ flowing process time periods at substantially the same temperature.

Referring to the graph, more W$_2$N crystal peaks are shown as the NH$_3$ flowing process time period or temperature increase when forming the capping nitride layer. Furthermore, more W$_2$N crystal peaks are shown as the NH$_3$ flowing process time period increases even at substantially the same temperature. That is, more W$_2$N reactions are generated as the NH$_3$ flowing process time period increases. Table 1 below compares properties of W and W$_2$N.

TABLE 1

| | STRUCTURE | LATTICE CONSTANT | MODULUS OF ELASTICITY | THERMAL EXPANSION COEFFICIENT |
|---|---|---|---|---|
| W | Body centered cubic (BCC) | 2.238 Å | $5.5 \times 10^{11}$ Pa | $4.16 \times 10^{-6} + 1.53 \times 10^{-9}$ T |
| W$_2$N | Cubic | 2.382 Å | $4 \times 10^{11}$ Pa | $5.01 \times 10^{-6} + 3.44 \times 10^{-9}$ T |

Referring to Table 1, W$_2$N has a larger lattice constant, a larger thermal expansion coefficient, and a smaller modulus of elasticity than W. With these properties, W$_2$N at the surface of the tungsten supplies tensile stress to the tungsten.

Figure 8:
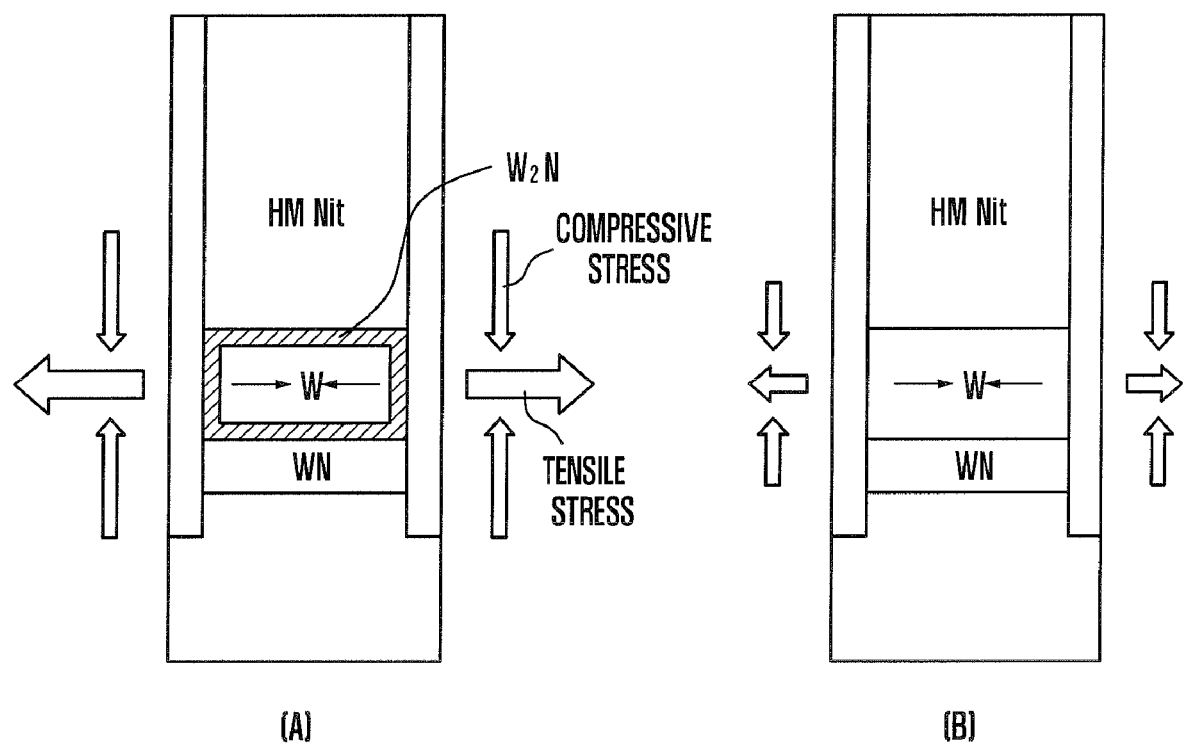
FIG. 8 illustrates diagrams comparing $W_2N$ production depending on different $NH_3$ flowing times and temperatures.

FIG. 8 illustrates diagrams comparing W$_2$N production depending on different NH$_3$ flowing process times and temperatures. Tungsten nitride (WN) is used as a barrier metal and a tungsten layer is formed over the WN. When the NH$_3$ flowing process is performed for a long period of time at a high temperature, refer to (A) in FIG. 8, portions of the WN at sidewalls and bottom portions of the tungsten layer may generate a W$_2$N crystallization reaction when a capping nitride layer is formed. Tensile stress is supplied due to the W$_2$N reaction and thus compressive stress is relieved.

Meanwhile, when the NH$_3$ flowing process is performed for a short period of time at a low temperature, refer to (B) in FIG. 8, a W$_2$N reaction in the tungsten layer and WN is controlled while forming the capping nitride layer. Thus, tensile stress is controlled, causing compressive stress of the tungsten layer to be maintained.

Figure 9A:
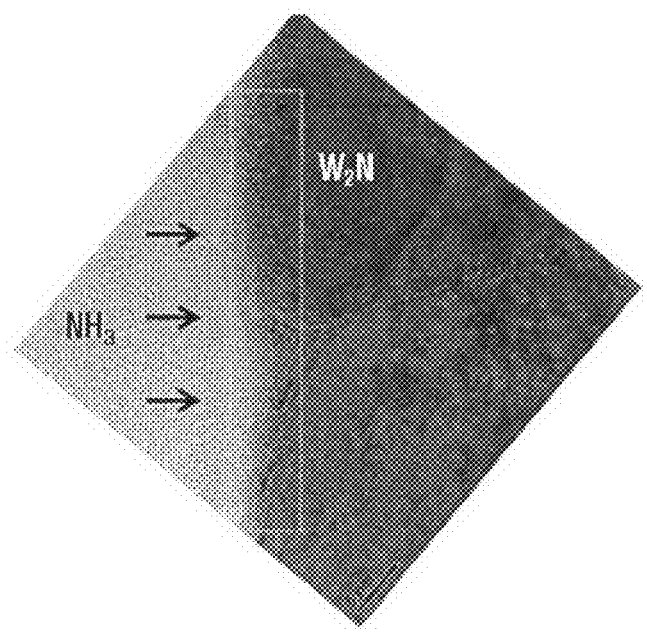
FIGS. 9A and 9B are micrograph views showing generation of $W_2N$ when an $NH_3$ flowing is performed for a long period of time at a high temperature.
Figure 9B:
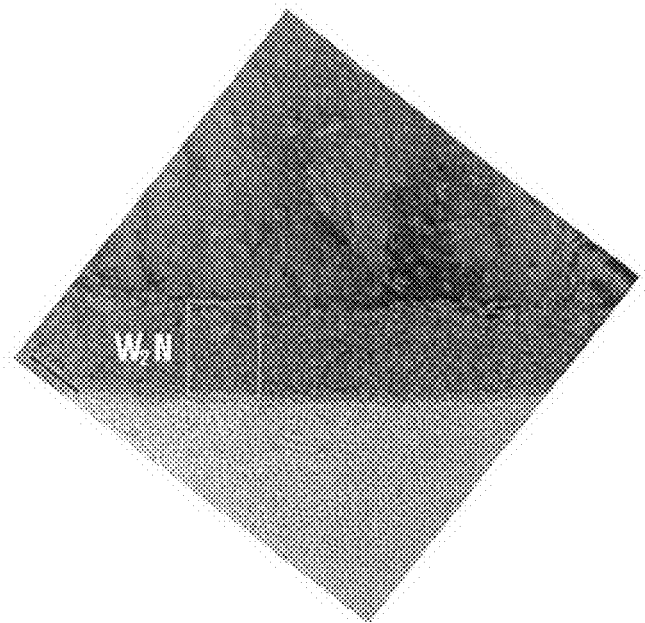

FIGS. 9A and 9B are micrograph views showing generation of $W_2N$ when an $NH_3$ flowing process is performed for a long period of time at a high temperature.

Figure 10A:
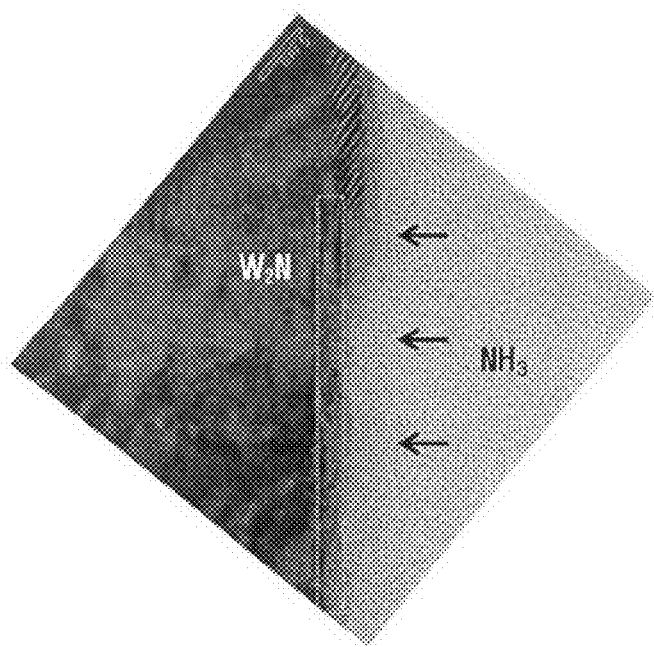
FIGS. 10A and 10B are micrograph views showing a $W_2N$ reaction controlled when an $NH_3$ flowing is performed for a short period of time at a low temperature.
Figure 10B:
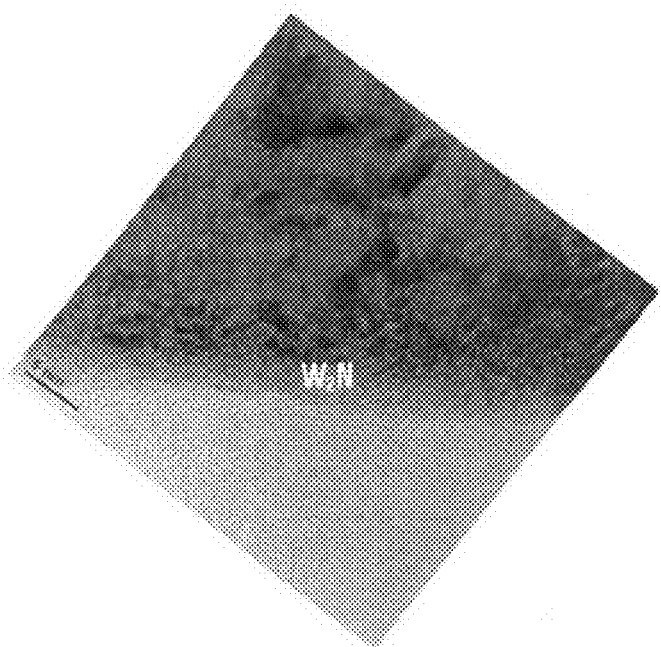

FIGS. 10A and 10B are micrograph views showing a $W_2N$ reaction controlled when $NH_3$ flowing process is performed for a short period of time at a low temperature.

Referring to FIGS. 9A and 9B, a $W_2N$ reaction is generated (FIG. 9A) at a sidewall of a tungsten layer due to $NH_3$ gas. Also, the $W_2N$ reaction is accelerated (FIG. 9B) as the $NH_3$ gas is supplied to a tungsten nitride layer below the tungsten layer through a grain boundary of the tungsten layer. Thus, a $W_2N$ layer is formed to a large thickness ranging of approximately 60 Å to approximately 130 Å over the sidewalls of the tungsten layer and the tungsten nitride layer.

Referring to FIGS. 10A and 10B, when the $NH_3$ flowing process is performed for a short period of time at a low temperature, a $W_2N$ reaction is minimized at sidewalls of a tungsten layer (FIG. 10A). Also, a $W_2N$ reaction rarely occurs in a tungsten nitride layer below the tungsten layer because supplying $NH_3$ gas is controlled (FIG. 10B). A $W_2N$ layer is formed with a significantly small thickness ranging of approximately 30 Å to approximately 50 Å over the sidewalls of the tungsten layer and the tungsten nitride layer when compared to FIGS. 9A and 9B.

Figure 11:
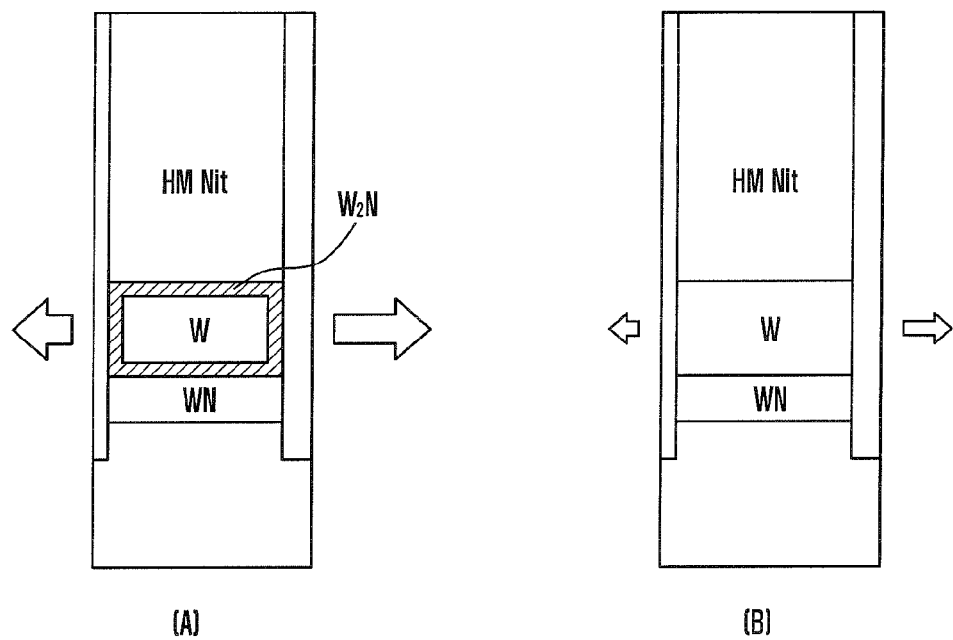
FIG. 11 illustrates diagrams comparing asymmetric formation of capping nitride layers on gate stacks.

FIG. 11 illustrates diagrams comparing bilaterally asymmetric formation of capping nitride layers on gate stacks. FIG. 11A represents a gate stack on which an $NH_3$ flowing process is performed for a long period of time at a high temperature. FIG. 11B represents a gate stack on which an $NH_3$ flowing process is performed for a short period of time at a low temperature. When the capping nitride layers are formed asymmetrically from one side to the other side of the gate stack, tensile stress supplied to the tungsten layer differs from one side to the other side.

Figure 12:
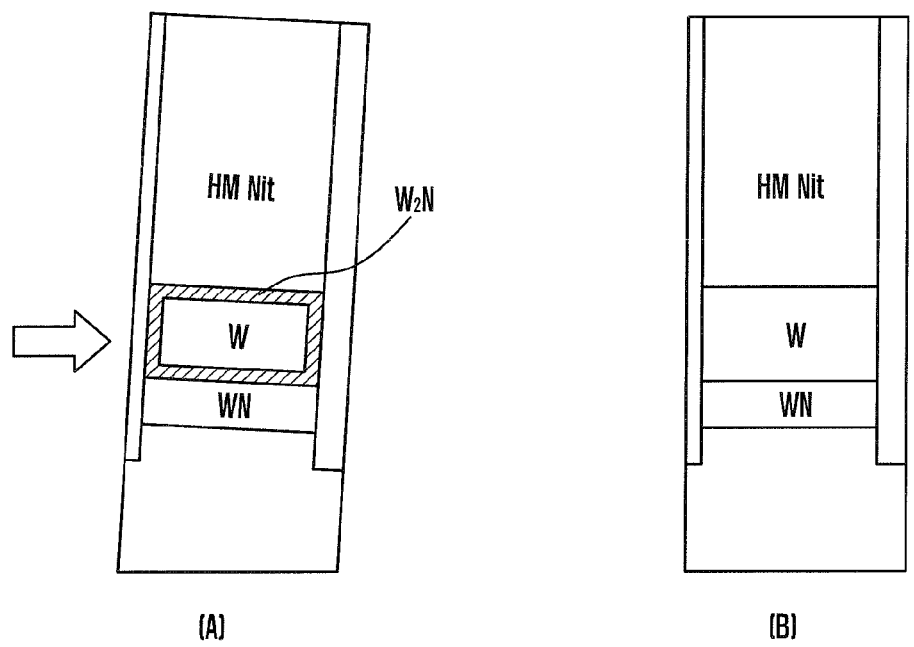
FIG. 12 illustrates diagrams comparing intensity of leaning according to bilateral asymmetry of capping nitride layers and different $NH_3$ flowing times and temperatures.

FIG. 12 illustrates diagrams comparing intensity of leaning according to bilateral asymmetry of capping nitride layers and different $NH_3$ flowing process times and temperatures. When a $NH_3$ flowing process is performed for a long period of time at a high temperature as shown in FIG. 12A, the difference between tensile stress supplied on one side to the other side of a gate stack becomes very large, and consequently, torque is generated. The torque may lead to a tilting of the gate.

On the other hand, when the $NH_3$ flowing process is performed for a short period of time at a low temperature as shown in FIG. 12B, very little or no tensile stress is supplied to the tungsten layer. Thus, the tensile stress difference is minimized, and consequently, the tilting of the gate may not occur.

As shown in FIGS. 7 to 12, a $W_2N$ reaction may be controlled by shortening the $NH_3$ flowing process time and lowering the temperature. Thus, tensile stress supplied to the tungsten layer may be minimized.

Minimizing tensile stress on the tungsten layer may control gate leaning caused by torque even if the capping nitride layer is formed asymmetrically from one side to the other side of the gate stack.

Table 2 shows that a trend of nitrification of a W layer in accordance with temperature and time of a $NH_3$ flowing process.

TABEL 2

| | Sample | | | | | |
|---|---|---|---|---|---|---|
| | #01 | #02 | #03 | #04 | #05 | #06 |
| Temperature | 630° C. | | 650° C. | | 710° C. | |
| Time | 1 min | 5 min | 1 min | 5 min | 1 min | 5 min |
| Thickness of $W_2N$ | 39 Å | 51 Å | 41 Å | 59 Å | 64 Å | 129 Å |

Referring to Table 2, it is recognized that degree of the nitrification of the W layer is more dependent on time than on temperature.

Figure 13:
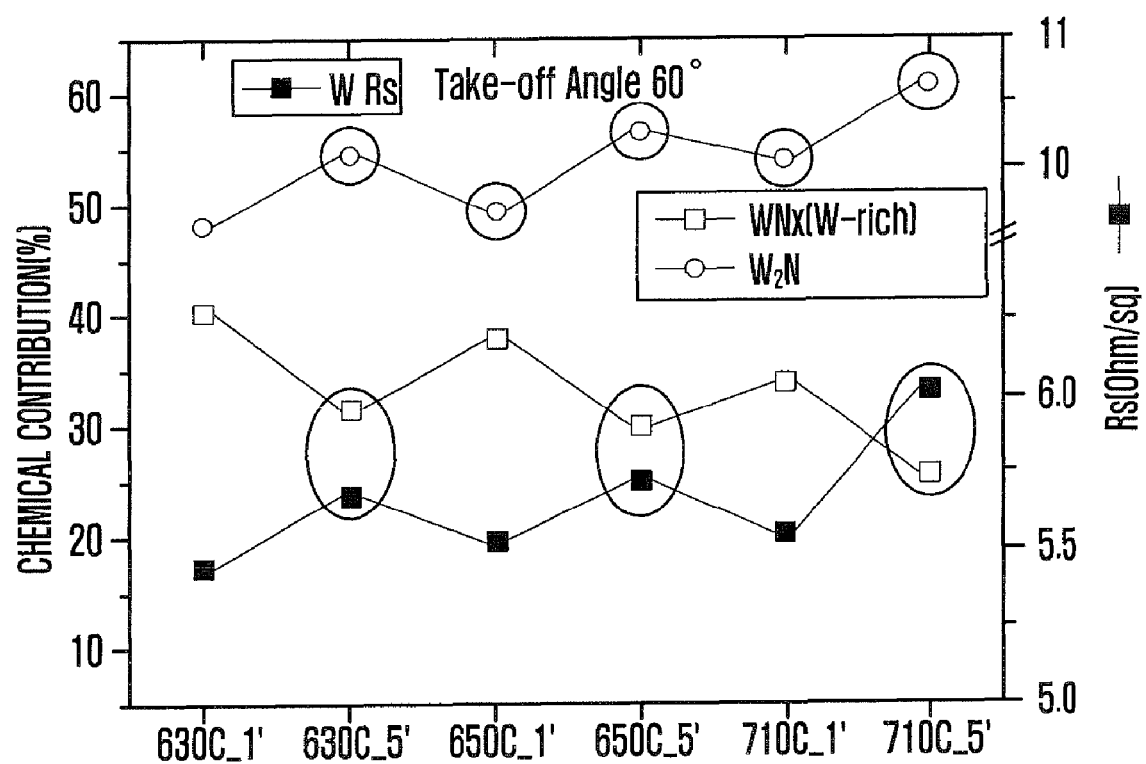
FIG. 13 illustrates a graph showing estimates of sheet resistance (Rs) and chemical contribution to the intensity of nitrification in tungsten according to an $NH_3$ flowing.

FIG. 13 illustrates a graph showing estimates of sheet resistance (Rs) and chemical contribution levels to the intensity of nitrification in tungsten according to a $NH_3$ flowing process. Regarding the chemical contribution level, the intensity of nitrification in tungsten increases as $NH_3$ flowing process time and temperature increase. Thus, the $W_2N$ contribution level increases whereas $WN_x$ decreases.

A resistivity value of tungsten including nitrogen, e.g., $WN_x$ and $W_2N$, becomes larger than a resistivity value when compared to a pure tungsten resistivity value. $W_2N$ has a larger resistivity value than $WN_x$ which has a large tungsten content (W-rich).

The tungsten resistivity value increases as the $NH_3$ flowing process time and temperature increase. This result is obtained because the resistivity value becomes large as the $NH_3$ flowing process time increases rather than the temperature and the resistivity value of $W_2N$ is larger than tungsten.

In particular, the sheet resistance value of $W_2N$ becomes larger when the $NH_3$ flowing process time increases. Shortening the $NH_3$ flowing process time and lowering the temperature lowers the tungsten resistivity value which is advantageous for a high speed operation.

Figure 14:
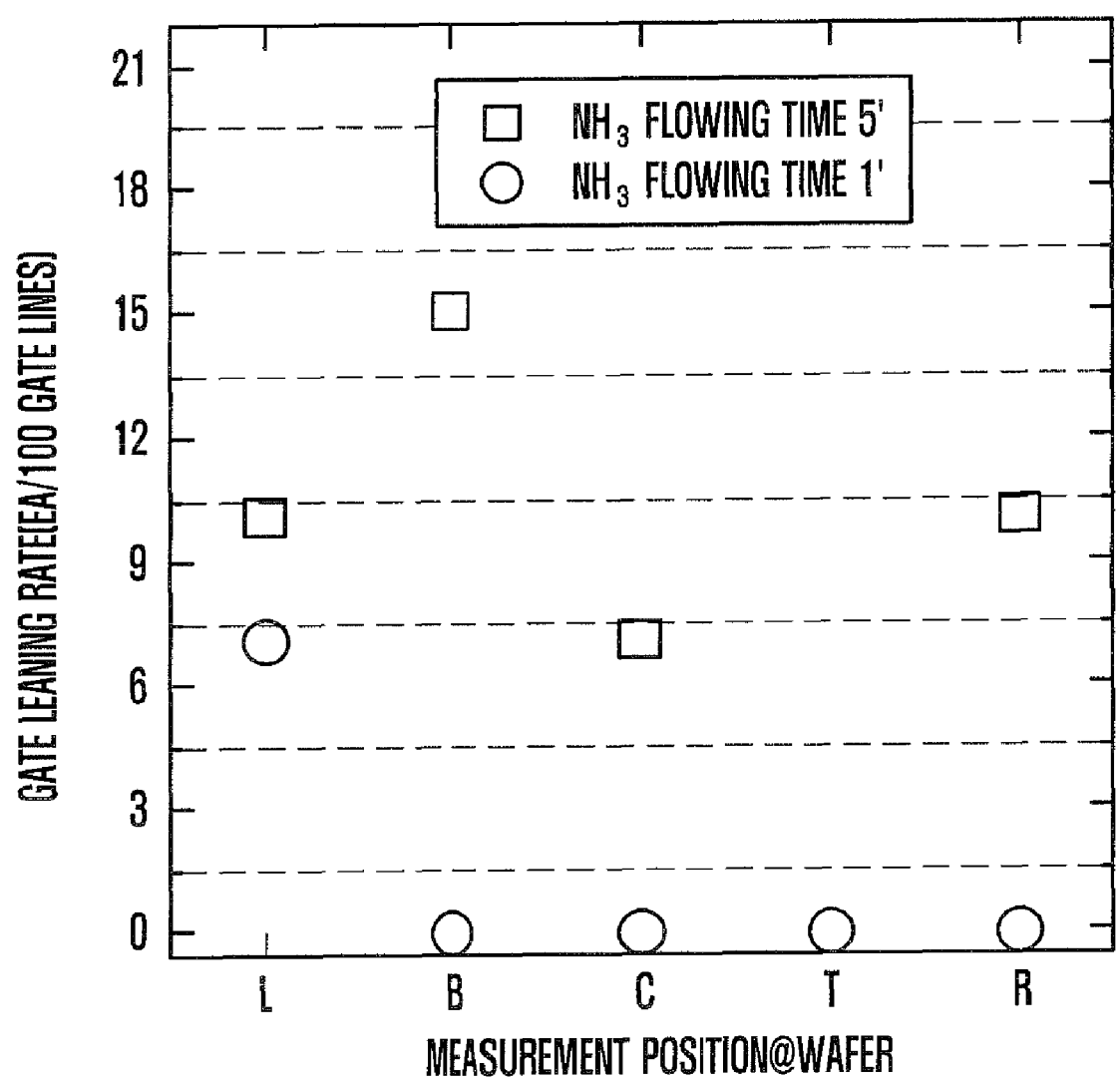
FIG. 14 illustrates a graph comparing the frequency of leaning according to different $NH_3$ flowing times.

FIG. 14 illustrates a graph comparing the frequency of leaning according to different $NH_3$ flowing process times. A $NH_3$ flowing process is performed at a temperature of approximately 650° C. for approximately 5 minutes and 1 minute in the graph. Reference denotations L, B, C, T, and R represent left, bottom, center, top, and right positions on a wafer, respectively. Limitations regarding leaning improve as the $NH_3$ flowing process time decreases.

Although the above embodiments described a gate stack including a tungsten layer, this invention may be applied to a tungsten bit line process and a metal line process using tungsten in a dynamic random access memory (DRAM). Also, this invention may be applied to a non-volatile memory which includes a metal line process using tungsten. Also, the present invention is not limited to the $NH_3$ flowing process at a low temperature for a short time. The $NH_3$ flowing process step of various types may be used to control the leaning of the pattern structure. For example, the $NH_3$ flowing process step may be performed at a high temperature (i.e., higher than 700° C.) for no more than 5 minutes, or no more than 3 minutes, or 1 minute. Depending on application, the $NH_3$ flowing process step may conceivably be performed at a high temperature for more than 5 minutes. As will be understood by those skilled in the art, the present invention relates to a broader concept of relieving the stress generated in a patterned structure by performing a $NH_3$ flowing process step.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:

forming a patterned structure including a first layer including tungsten over a substrate;

providing a first nitrogen source gas in a chamber for a first period of time, the substrate being provided within the chamber; and providing a silicon source gas and a second nitrogen source gas in the chamber to form a capping layer over the patterned structure, the capping layer including silicon and nitrogen;

wherein the first nitrogen source gas is applied to the first layer at an elevated temperature for the first period of time in order to control a reaction between the first layer and nitrogen from the second nitrogen source gas.

2. The method for fabricating a semiconductor device according to claim 1, wherein the first nitrogen source gas and the second nitrogen source gas are the same type.

3. The method for fabricating a semiconductor device according to claim 1, wherein the providing-a-first-nitrogen-source-gas step and the providing-a-silicon-source-gas-and-a-second-nitrogen-source-gas step are performed in-situ.

4. The method for fabricating a semiconductor device according to claim 1, wherein the elevated temperature is about 700° C. or less.

5. The method for fabricating a semiconductor device according to claim 1, wherein the providing-a-first-nitrogen-source-gas step is performed at a temperature ranging from approximately 600° C. to approximately 700° C. for no more than 5 minutes.

6. The method for fabricating a semiconductor device according to claim 1, wherein the providing-a-first-nitrogen-source-gas step and the providing-a-silicon-source-gas-and-a-second-nitrogen-source-gas step are performed at a temperature ranging from approximately 600° C. to approximately 700° C.

7. The method for fabricating a semiconductor device according to claim 1, wherein the silicon source gas is dichlorosilane and the second nitrogen source gas includes ammonia ($NH_3$) gas.

8. The method for fabricating a semiconductor device according to claim 1, wherein the first nitrogen source gas and the second nitrogen source gas each includes ammonia ($NH_3$) gas.

9. The method for fabricating a semiconductor device according to claim 1, wherein the chamber is a low pressure chemical vapor deposition (LPCVD) apparatus or a plasma enhanced chemical vapor deposition (PECVD) apparatus.

10. The method for fabricating a semiconductor device according to claim 1, wherein the first layer comprises a tungsten layer, a tungsten nitride layer, or a stack structure including a tungsten layer and a tungsten nitride layer.

11. A method for fabricating a gate in a semiconductor device, comprising:

forming a gate stack structure including a silicon layer and a tungsten-based layer over a substrate;

etching the gate stack structure until a portion of the silicon layer is etched to form a first patterned structure, the first patterned structure including the tungsten-based layer and the etched polysilicon layer;

forming capping layers over sidewalls of the first patterned structure using a source gas including nitrogen; and etching the remaining silicon layer to form a second patterned structure, wherein, before forming the capping layers, a gas flowing process is performed at a given temperature for a given period of time in a gas ambience including nitrogen, so that a reaction between the tungsten-based layer and the nitrogen included in the source gas used when forming the capping layers is controlled.

12. The method for fabricating a gate in a semiconductor device according to claim 11, wherein the gas flowing process is performed at a temperature ranging from approximately 600° C. to approximately 700° C. for approximately to no more than 5 minutes.

13. The method for fabricating a gate in a semiconductor device according to claim 11, wherein the gas flowing process and forming the capping layers are performed in-situ at substantially the same temperature.

14. The method for fabricating a gate in a semiconductor device according to claim 11, wherein forming the capping layers comprises using a source gas including ammonia ($NH_3$) gas.

15. The method for fabricating a gate in a semiconductor device according to claim 11, wherein forming the capping layers comprises using $NH_3$ gas and a gas including silicon.

16. The method for fabricating a gate in a semiconductor device according to claim 11, wherein the gas flowing process and forming the capping layers are performed in a low pressure chemical vapor deposition (LPCVD) apparatus or a plasma enhanced chemical vapor deposition (PECVD) apparatus.

17. The method for fabricating a gate in a semiconductor device according to claim 11, wherein the tungsten-based layer comprises a tungsten layer or a tungsten nitride layer, or both.

18. The method for fabricating a gate in a semiconductor device according to claim 11, wherein the silicon layer in the gate stack structure comprises a polysilicon layer and the tungsten-based layer in the gate stack structure comprises a tungsten layer.

19. The method for fabricating a gate in a semiconductor device according to claim 18, wherein a barrier metal is formed between the polysilicon layer and the tungsten layer and a hard mask layer including nitride formed over the tungsten layer.

20. The method for fabricating a gate in a semiconductor device according to claim 19, wherein the barrier metal comprises a tungsten nitride layer.

* * * * *